(12) United States Patent
Abou-Chahine et al.

(10) Patent No.: US 9,484,874 B2
(45) Date of Patent: Nov. 1, 2016

(54) INPUT AMPLITUDE MODULATED OUTPHASING WITH AN UNMATCHED COMBINER

(71) Applicant: Nokia Solutions and Networks Oy, Espoo (FI)

(72) Inventors: Zeid Abou-Chahine, Ulm (DE); Tilman Felgentreff, Holzkirchen (DE)

(73) Assignee: Nokia Solutions and Networks Oy, Espoo (FI)

( * ) Notice: Subject to any disclaimer, the term of this patent is extended or adjusted under 35 U.S.C. 154(b) by 0 days.

(21) Appl. No.: 14/443,095

(22) PCT Filed: Nov. 16, 2012

(86) PCT No.: PCT/EP2012/072900
§ 371 (c)(1),
(2) Date: May 15, 2015

(87) PCT Pub. No.: WO2014/075736
PCT Pub. Date: May 22, 2014

(65) Prior Publication Data
US 2015/0295552 A1    Oct. 15, 2015

(51) Int. Cl.
| | | |
|---|---|---|
| H04B 1/04 | (2006.01) | |
| H03F 3/68 | (2006.01) | |
| H03F 1/02 | (2006.01) | |
| H03F 3/24 | (2006.01) | |

(52) U.S. Cl.
CPC .............. *H03F 3/68* (2013.01); *H03F 1/0294* (2013.01); *H03F 3/245* (2013.01); *H03F 2203/21142* (2013.01); *H03F 2203/21157* (2013.01)

(58) Field of Classification Search
CPC .... H03F 2200/336; H03F 3/68; H03F 3/245; H04B 1/04; H04L 27/34; H04L 27/36
USPC .................. 455/108, 114.3, 126, 127.3, 144; 375/298, 297, 300; 330/10
See application file for complete search history.

(56) References Cited

U.S. PATENT DOCUMENTS

| | | | |
|---|---|---|---|
| 7,570,711 B1* | 8/2009 | Chavez ................. | H03F 1/0294 330/10 |
| 7,826,553 B2* | 11/2010 | Chen ..................... | H03F 1/0294 375/264 |
| 9,083,294 B2* | 7/2015 | Kermalli ................ | H03F 1/025 |
| 9,190,967 B2* | 11/2015 | Ma ............................ | H03F 3/21 |
| 2008/0019456 A1 | 1/2008 | Chen et al. ................... | 375/264 |
| 2009/0072898 A1 | 3/2009 | Sorrells et al. ............... | 330/127 |

* cited by examiner

Primary Examiner — Sonny Trinh
(74) Attorney, Agent, or Firm — Harrington & Smith

(57) ABSTRACT

An amplifier system is disclosed, configured to apply a signal component separator algorithm such that the first phase modulated signal and the second phase modulated signal are allowed to take on several continuous amplitude levels in order to achieve a maximum efficiency at each desired output signal power level, without restricting the input signal power fed to the power amplifiers to a constant level, wherein for each desired output signal power level, the digital signal component separator assigns an amplitude and phases of input signals that result in a maximum instantaneous power efficiency at the amplified output signal combined with an unmatched/non-isolating combiner (e.g. Chireix combiner).

17 Claims, 8 Drawing Sheets

INPUT AMPLITUDE MODULATED OUTPHASING WITH AN UNMATCHED COMBINER

FIELD OF THE INVENTION

The exemplary and non-limiting embodiments of this invention relate to signal amplification, and more particularly to input amplitude modulated outphasing (IAMO) with an unmatched combiner.

BACKGROUND ART

The following description of background art may include insights, discoveries, understandings or disclosures, or associations together with disclosures not known to the relevant art prior to the present invention but provided by the invention. Some such contributions of the invention may be specifically pointed out below, whereas other such contributions of the invention will be apparent from their context.

Amplifiers may be used to amplify a signal. In a communications system, power amplifiers may be used to amplify radio frequency (RF) signals in a transmitter before the signals are transmitted to a receiver.

SUMMARY

The following presents a simplified summary of the invention in order to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to the more detailed description that is presented later.

Various aspects of the invention comprise a system, method, transmitter, base station, mobile unit, use and circuit element as defined in the independent claims. Further embodiments of the invention are disclosed in the dependent claims.

An aspect of the invention relates to an amplifier system comprising a digital signal component separator configured to split an amplitude and phase modulated signal into a first phase modulated signal and a second phase modulated signal, a non-isolating combiner configured to perform a signal summation of the first phase modulated signal and the second phase modulated signal, a first power amplifier configured to perform amplification of the first phase modulated signal before the signal summation, and a second power amplifier configured to perform amplification of the second phase modulated signal before the signal summation, wherein the amplifier system is configured to apply a signal component separator algorithm such that the first phase modulated signal and the second phase modulated signal are allowed to take on several discrete and/or continuous amplitude levels in order to achieve a maximum efficiency at each desired output signal power level, without restricting the input signal power fed to the power amplifiers to a constant level, wherein for each desired output signal power level, the digital signal component separator assigns an amplitude and phases of input signals that result in a maximum instantaneous power efficiency of the amplifier system.

A further aspect of the invention relates to a method for operating an amplifier system comprising a digital signal component separator configured to split an amplitude and phase modulated signal into a first phase modulated signal and a second phase modulated signal, a non-isolating combiner configured to perform a signal summation of the first phase modulated signal and the second phase modulated signal, a first power amplifier configured to perform amplification of the first phase modulated signal before the signal summation, and a second power amplifier configured to perform amplification of the second phase modulated signal before the signal summation, wherein the method comprises applying a signal component separator algorithm such that the first phase modulated signal and the second phase modulated signal are allowed to take on several discrete and/or continuous amplitude levels in order to achieve a maximum efficiency at each desired output signal power level, without restricting the input signal power fed to the power amplifiers to a constant level, wherein for each desired output signal power level, the digital signal component separator assigns an amplitude and phases of input signals that result in a maximum instantaneous power efficiency of the amplifier system.

A still further aspect of the invention relates to a transmitter comprising an antenna for transmitting a radio frequency RF signal, and said amplifier system.

A still further aspect of the invention relates to a base station comprising said transmitter.

A still further aspect of the invention relates to a mobile unit comprising said transmitter.

A still further aspect of the invention relates to a use of said amplifier system for amplifying an input signal.

A still further aspect of the invention relates to circuit element for an amplifier system, the system comprising a digital signal component separator configured to split an amplitude and phase modulated signal into a first phase modulated signal and a second phase modulated signal, a non-isolating combiner configured to perform a signal summation of the first phase modulated signal and the second phase modulated signal, a first power amplifier configured to perform amplification of the first phase modulated signal before the signal summation, and a second power amplifier configured to perform amplification of the second phase modulated signal before the signal summation, wherein the circuit element is configured to apply a signal component separator algorithm such that the first phase modulated signal and the second phase modulated signal are allowed to take on several discrete and/or continuous amplitude levels in order to achieve a maximum efficiency at each desired output signal power level, without restricting the input signal power fed to the power amplifiers to a constant level, wherein for each desired output signal power level, the digital signal component separator assigns an amplitude and phases of input signals that result in a maximum instantaneous power efficiency of the amplifier system.

BRIEF DESCRIPTION OF THE DRAWINGS

In the following the invention will be described in greater detail by means of exemplary embodiments with reference to the attached drawings, in which.

DETAILED DESCRIPTION OF SOME EMBODIMENTS

With the existing communications throughput continuously being drifted toward higher data rates, bandwidth has become a scarce resource. For physical considerations linked to the transmission properties of an operating frequency, mobile broadband was found to be best suited for a frequency range of about 450 MHz to 5400 MHz. This frequency limitation has urged communications researchers and engineers to come up with ingenious methods in order to cope with the seemingly ever increasing demand for an already occupied spectrum. Efforts have resulted in the emergence of what is called spectrum efficient modulation techniques. Complex modulation techniques of next generation communication systems, such as a multiquadrature amplitude modulation (MQAM) technique, heavily exploit the signal's variation in amplitude. While this allows the spectrum to be used more efficiently (given the same bandwidth, it allows to transmit/receive significantly higher data rates than feasible with older techniques), it comes at the hurdle of increased signal dynamics. As the efficiency of a conventional PA degrades severely with increasing signal excursions, the work on PA concepts alleviating this drawback has been placed on track long time ago. Among several candidates, the outphasing architecture targets the objective of transmitting high peak-to-average power ratio (PAPR) signals with high efficiency performance.

Figure 1:
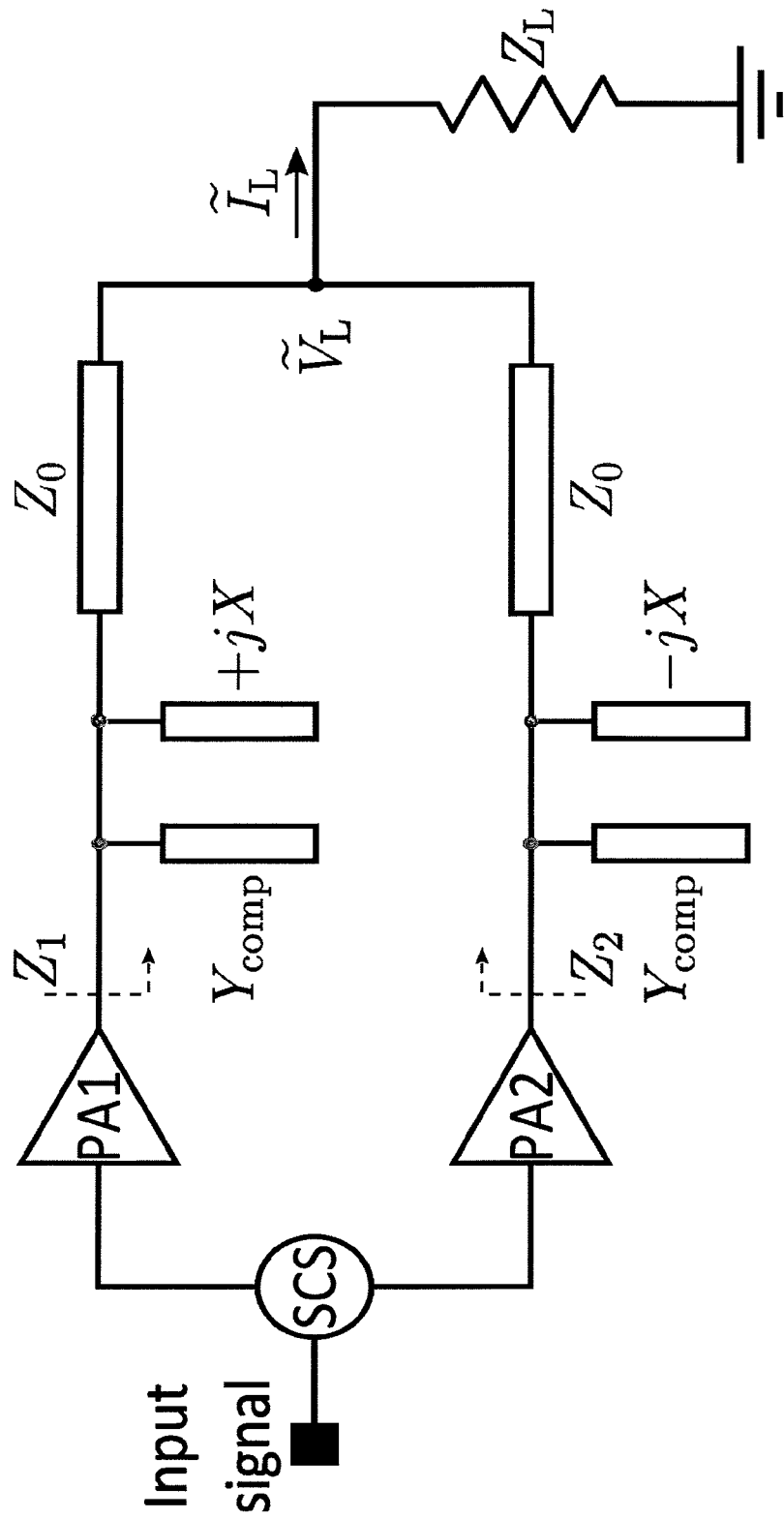
FIG. 1 shows a simplified block diagram illustrating an exemplary amplifier system.

An outphasing topology may comprise a signal component separator (SCS) that splits the generally amplitude modulated (AM) and phase modulated (PM) signal into two constant amplitude PM signals such that their sum is equivalent to the original signal. Since the resulting signals are only PM, the outphasing concept suggests then the usage of two (efficient) nonlinear amplifiers to perform amplification just before the final step of signal summation, thus allowing recapture ideally an amplified replica of the input. FIG. 1 illustrates a Chireix outphasing concept, wherein SCS illustrates a signal component separator, PA1 and PA2 illustrate power amplifiers, $Z_1$ and $Z_2$ represent impedances, $Y_{comp}$ illustrates a compensation element determined as the compensation of the drain to source capacitance $C_{ds}$ and package parasitic admittance of the transistor, +jX and -jX illustrate the Chireix elements computed as in formula (1) where $\theta_c$ can be found in relation to the desired modulation and PAPR, $\tilde{I}_L$ represents an output current, $V_L$ represents an output voltage, $Z_0$ represents a line impedance and $Z_L$ represents a load impedance.

$$X = \frac{\sin 2\theta_c}{2Z_L}. \quad (1)$$

Figure 2:
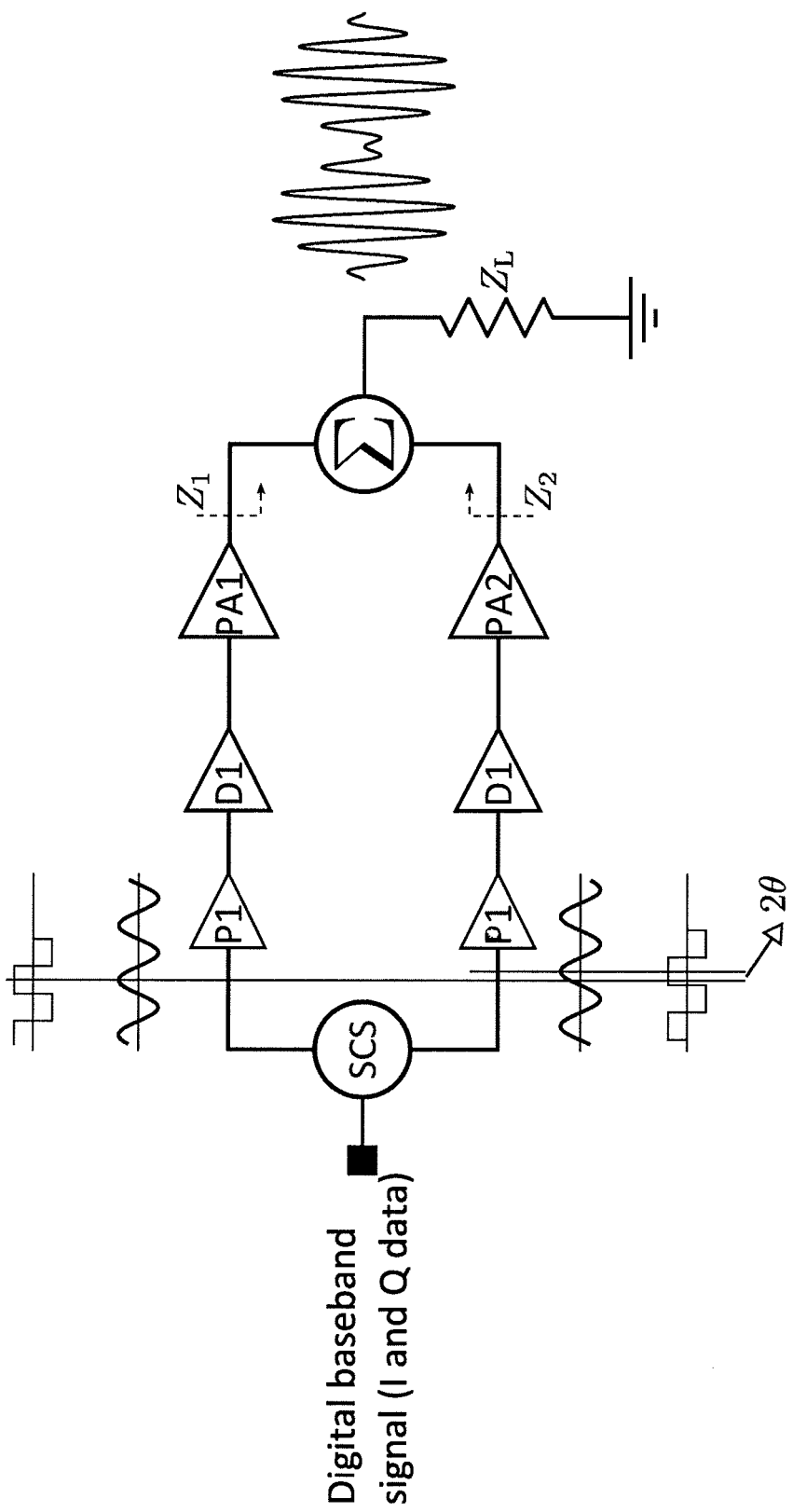
FIG. 2 shows a simplified block diagram illustrating an exemplary amplifier system.

FIG. 2 illustrates an outphasing concept with a possibility to be driven with digital signals, wherein SCS illustrates a signal component separator, P1 and P2 illustrate predriver power amplifiers, D1 and D2 illustrate driver power amplifiers, PA1 and PA2 illustrate (final stage) power amplifiers, Σ illustrates a non-isolating combiner, $Z_1$ and $Z_2$ represent impedances, θ represents an outphasing angle, and $Z_L$ represents a load impedance.

Figure 3:
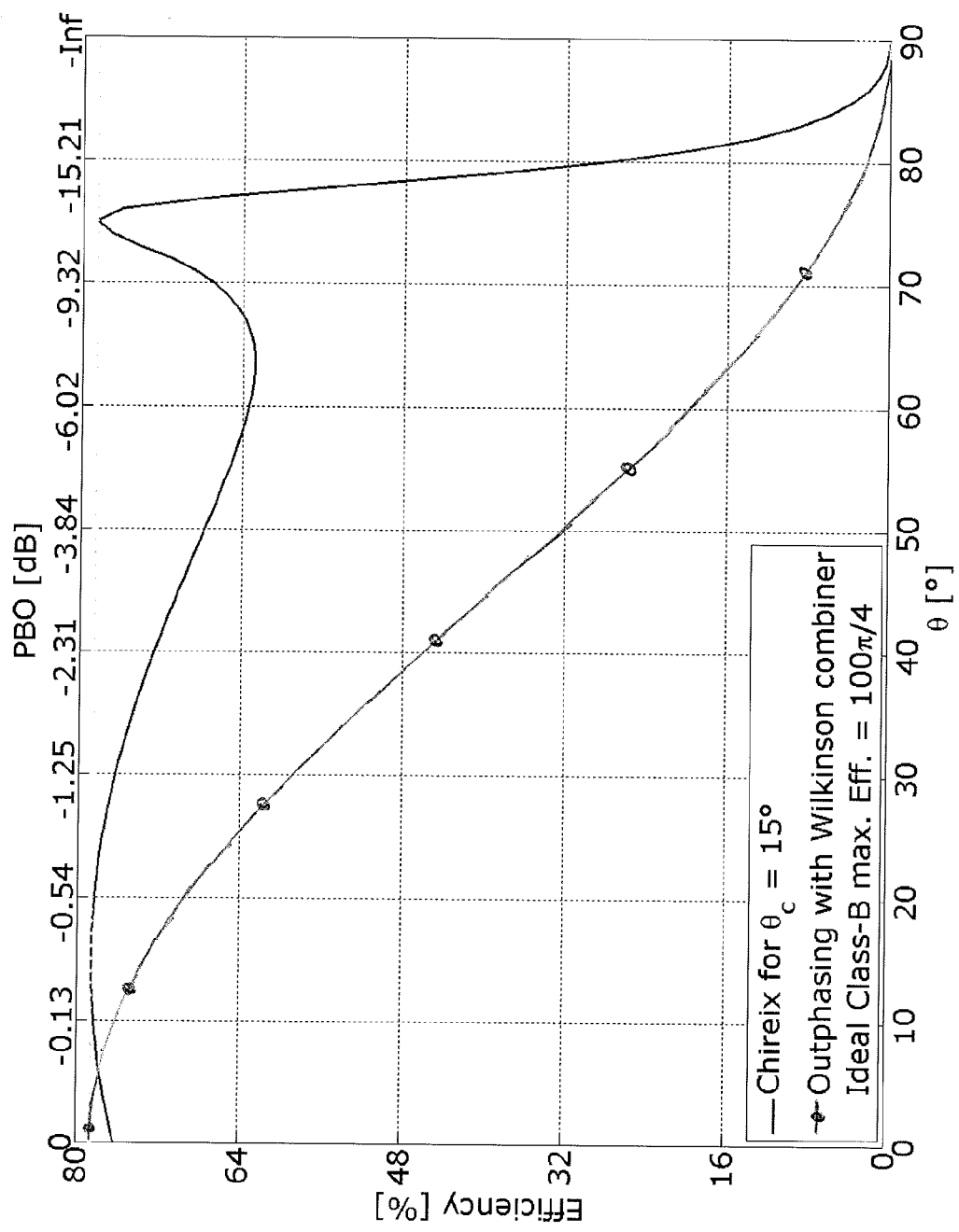
FIG. 3 illustrates outphasing efficiency with ideal class-B PA blocs.

FIG. 3 illustrates Chireix outphasing efficiency with ideal class-B PA blocs.

Employing nonlinear PAs is driven by the motive of achieving high efficiency. Nonlinear PAs feeding static loads are efficient because they are operated at (or near) saturation (no load variation is allowed in order to guarantee a saturation mode). As a result, without any kind of manipulations, they do deliver a constant output power as they operate at their optimum point when driven by PM signals. Therefore if it is desired to employ nonlinear PAs for their efficiency advantage in these conditions, one is subsequently restricting the output power of the PAs to a constant level. Since the output signal to be transmitted from the antenna is essentially carried by an AM signal, its power is not a constant anymore as in the case of only PM signals. This leads to a conclusion that for generating AM signals with the outphasing principle using efficient nonlinear PAs (in the original conditions mentioned above), the combiner has to be a lossy component. Otherwise, summing two constant power signals with supposedly a 100% efficient combiner would produce a constant amplitude (envelope) signal, i.e. no AM transmission would be possible. An original outphasing technique has been described to qualify as a linear amplification with a non-linear components (LINC) scheme, but its efficiency enhancement capabilities remained unclear.

On the other hand, a Chireix technique employs a lossless unmatched/on-isolating combiner. This implies the scarification of the condition on the PAs remaining in their saturation mode (PAs seeing a constant load) as load modulation takes place. It has been stated that the Chireix original analysis has left some misunderstandings about what the technique could provide.

Under these circumstances, the efficiency issue seems yet unresolved, since in the first case, operating PAs in high efficiency mode comes at the cost of efficiency reduction due to the automatic implication of a lossy combiner, while in the latter case, a lossless combiner means a drift from the PA's saturation region and an automatic loss in PAs efficiency.

The outphasing architecture as originally presented in these two alternatives has not yet seen any kind of widespread use in communications industry. Communications researchers have experienced that regardless of whether isolated (Wilkinson) or unmatched (Chireix) combining is implemented, the conventional outphasing concept still needs to be modified somehow to be able to serve high PAPR signals with high efficiency. As a result, several variations of it are being proposed such as adaptive outphasing, outphasing with energy recovery besides asymmetric outphasing.

Adaptive outphasing belongs to the family of load modulated PA architectures. It involves dynamically varying the load impedance that the transistors see instantaneously in correspondence with the desired output power so that the best efficiency is achieved for each power level. This is done by introducing nonlinear voltage controlled components in the output matching network such as varicaps. While this enhances the efficiency, control signals are performed at signal speeds imposing a constraint on the implementation. Another disabling obstacle is scaling this architecture to high power levels in the range of 300 W and more. Furthermore, losses and nonlinearities associated with the introduced varactor diodes severely damage efficiency improvement and linearizability of the PA. Due to current technology limitations in providing high speed varicaps for high power applications, this variant of outphasing if successfully implemented is unlikely to surpass the low power area such as the field of a mobile user equipment and reach a BTS level.

Outphasing with energy recovery is based on the implementation of the outphasing PA using a Wilkinson combiner. Instead of an isolation resistor, however, a bridge rectifier with equivalent input impedance of the isolation resistor is integrated in order to harvest the otherwise dissipated heat energy and feed it back to the supply through an energy storage capacitor. This allows the PAs to remain in saturation by guaranteeing an isolation between them, while also recovering energy especially at large outphasing angles. A theoretical study providing an upper limit of the efficiency to be reached in practice took into consideration statistical properties of a signal to be transmitted. The result was: assuming a 75% PA saturation efficiency, a turbo-outphasing architecture has a 23.2% average efficiency for a WCDMA signal with PAPR of 7.5 dB. This lacks behind a state of a Doherty PA's average efficiency near 50%. Although the idea looks promising, in reality it would only be possible to recover a small portion of the energy due to multiplicative effects of rectifier and DC-DC converter efficiencies.

Multilevel asymmetric outphasing on the other hand has also been studied. In an outphasing architecture, the use of two (or more) distinct voltage supply levels at the drain side allows enhancing the efficiency over symmetric outphasing, while still inheriting its linearity characteristics. For instance, the average efficiency may be boosted theoretically to 36% for a WCDMA signal with 7.5 dB PAPR. Further increasing the number of levels brings in additional efficiency. This however complicates the supply circuitry going in the direction of envelope tracking (ET) where bandwidth problems have been experienced in the modulator's implementation. While multilevel (and/or asymmetric) outphasing has been proposed at the input side as well, it was always operated with an isolating combiner (e.g. Wilkinson combiner). For these both cases, it may be said that one motivation is to reduce the outphasing angle(s) as it appears in the expression of the Wilkinson combiner efficiency, which in turn affects the overall efficiency. That is possible due to the exploitation of multileveling and/or asymmetry in the two signal paths of an isolated combining outphasing PA. Irrespective of the implementation technique, the load presented to the transistors stays constant. Making it in this way helps to reduce the power lost in the combiner, but does not allow benefiting from the load modulation concept. This enhances the efficiency beyond original outphasing, however, limits it below the existing Doherty performances, which is currently the typical load modulation architecture in RF PAs.

Each of these three variants requires incorporation of additional components beyond essential blocs of the outphasing PA (SCS, PA blocs, combiner), resulting in additional costs and the introduction of additional sources of product vulnerabilities, besides additional nonlinear behaviour, imposing additional challenges on digital predistorters (DPD).

Figure 4:
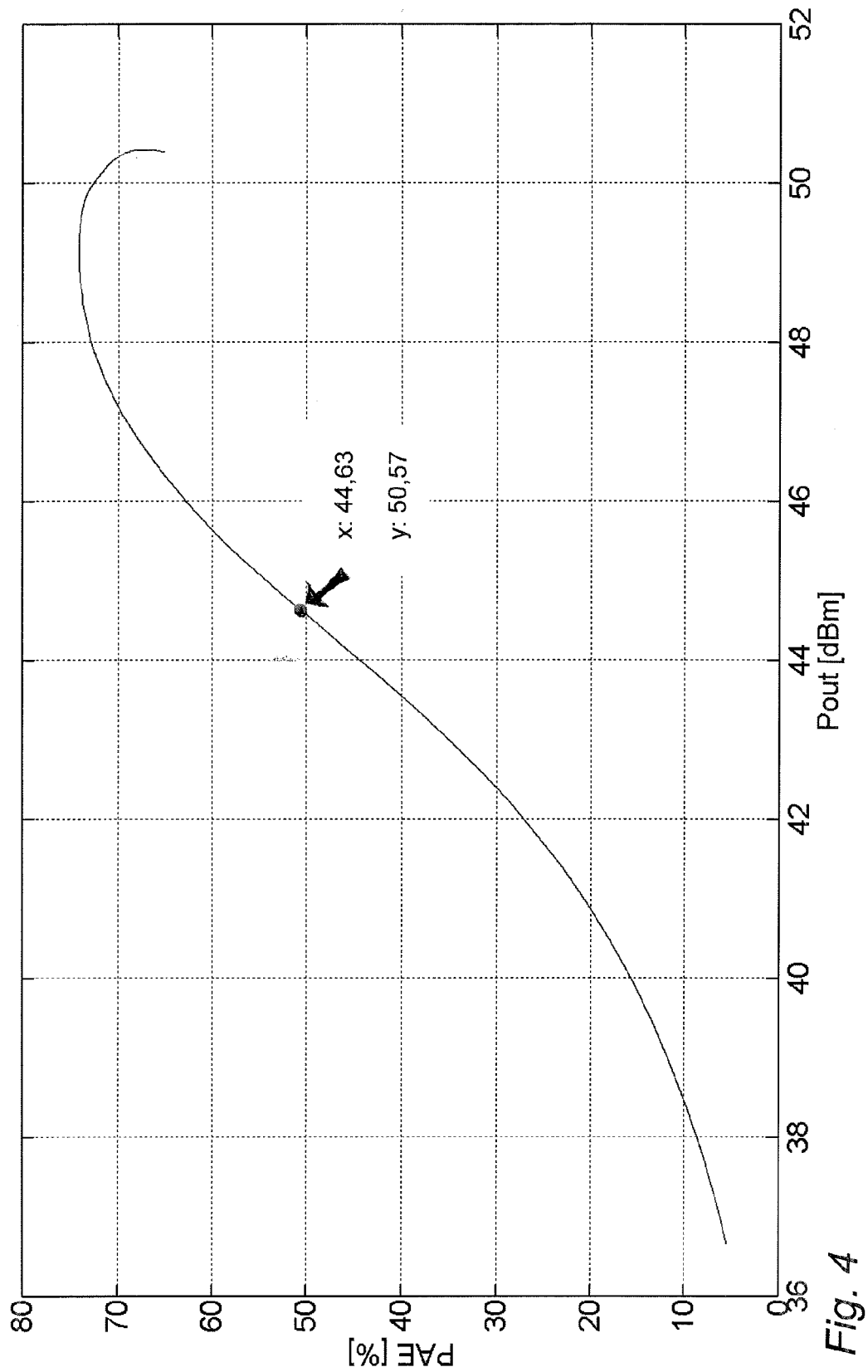
FIG. 4 illustrates outphasing efficiency with realistic ADS transistor models.
Figure 5:
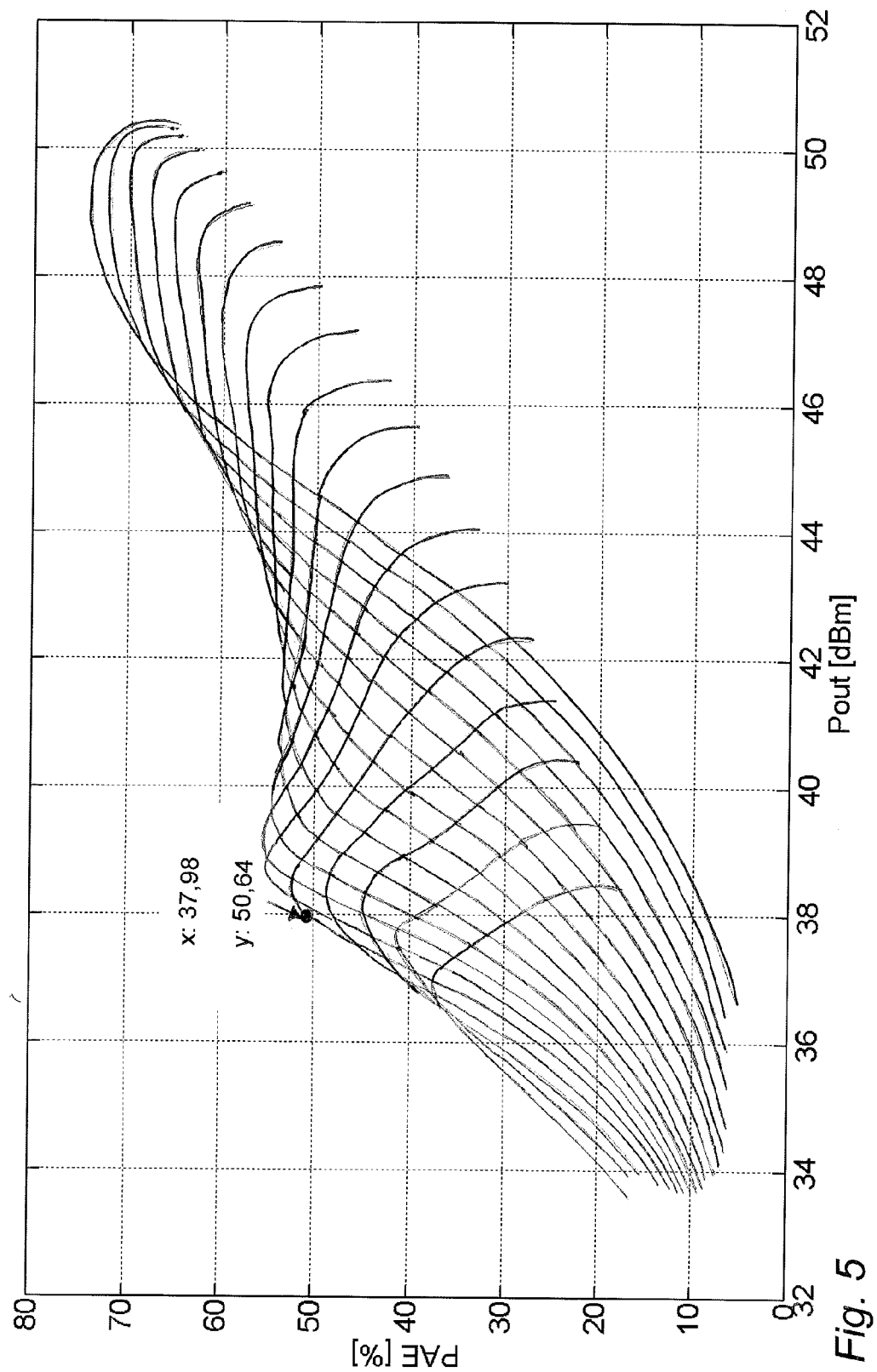
FIG. 5 illustrates IAMO efficiency with realistic ADS transistor models.
Figure 8:
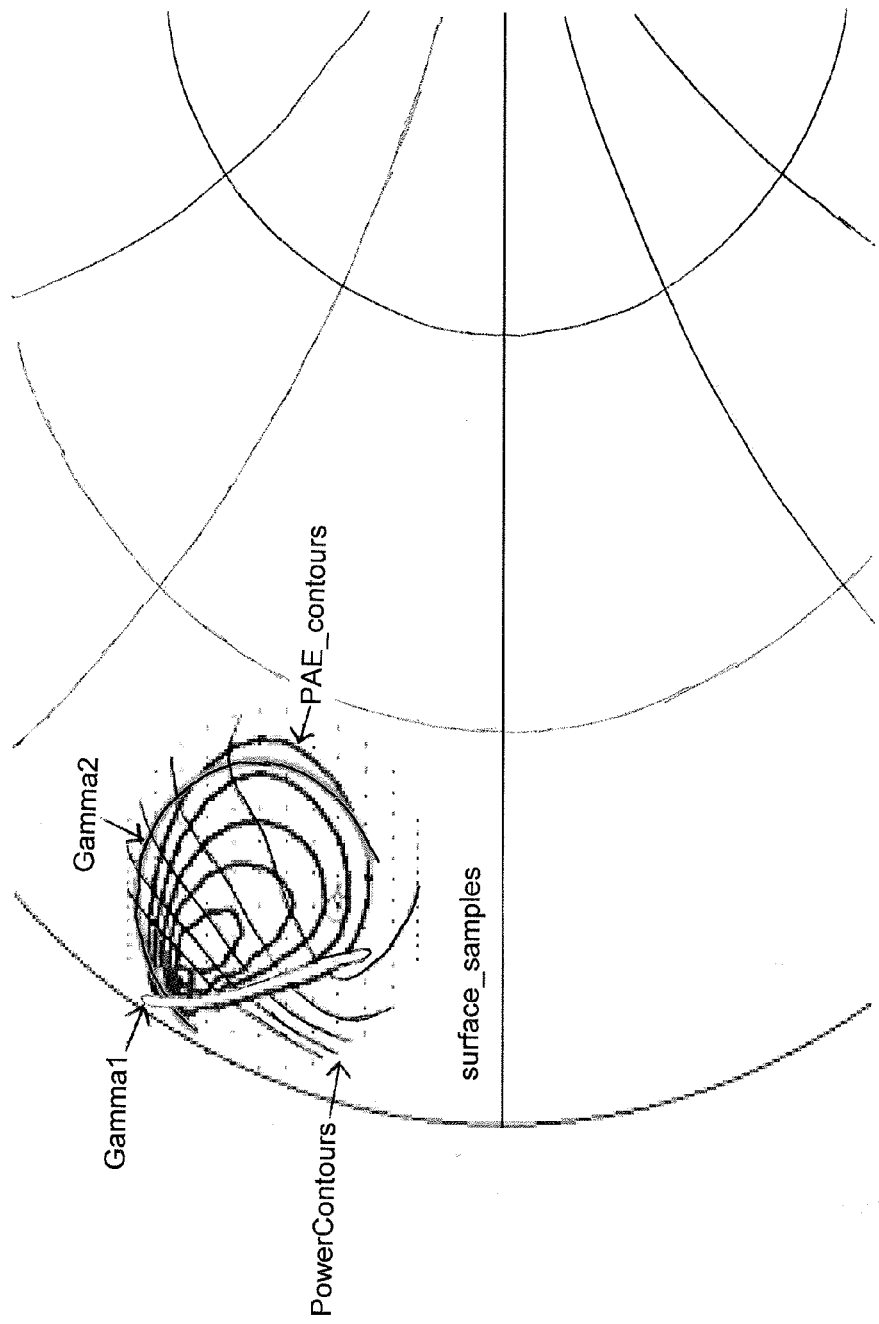
FIG. 8 illustrates outphasing load impedance tracks with realistic ADS transistor models.

An exemplary embodiment provides an input amplitude modulated outphasing PA corresponding to a BTS HW equipment. A power amplifier (PA) architecture exhibiting a high efficiency performance is revealed. In an exemplary embodiment, a variable amplitude drive scheme is suggested with a non-isolating combiner instead (e.g. with the Chireix combiner implementation). The input amplitude modulation outphasing implementation requires no component changes in the original Chireix outphasing concept (using non-isolating combiners, e.g. Chireix combiner) (FIG. 1). The signal component separator algorithm is however exploited in a radically different manner. Split outphased signals are allowed to take on several discrete and/or continuous amplitude levels in accordance with achieving the highest efficiency at each desired output power level. This means that the input power to the PA blocs is not restricted to a constant level anymore. This may look counterintuitive to the understanding of the outphasing concept which is motivated by driving the PAs into saturation each time with fixed input power; however a careful examination of this modification reveals that it results in an improved load modulation behaviour enabling higher average efficiencies. This may be clarified by examining outphasing angle dependent PA load impedances when superimposed over load pull contours. FIG. 8 shows the impedance tracks that each of the transistors "sees" superimposed on the load pull data on the Smith chart as the outphasing angle is swept. One can conclude that designing a good outphasing PA is equivalent to designing a combiner that allows the associated transistors' impedances to move on high efficiency tracks throughout outphasing action. FIG. 4 depicts the corresponding instantaneous efficiency as the outphasing angle $\theta$ is varied from 0° up to a near 90° value while the input power is held constant. Since the two transistors are all time connected, this makes the design more challenging than other load modulation methods, such as Doherty for instance, where at some time, only one transistor would be operating. It can be detected from FIGS. 4 and 8 that when going into a backoff of more than 6 dB, efficiency drops quickly as the loads are restricted to move on a couple of tracks lying in a low efficiency area on a Smith chart. By allowing AM modulation at the input of the two PAs, several load impedance track couples appear, with each one couple corresponding to a certain input power level and associated with the several corresponding load pull contour sets. The consequence of this technique is having more access to high efficiency areas on the Smith chart. The efficiency performance is shown in FIG. 5. Each curve corresponds to a fixed input power level, where only the outphasing angle $\theta$ was swept from 0° to 90° (therefore the angle between the two tracks from 0° to 180° as it corresponds to 2$\theta$). In a digital implementation, for each desired output power level, SCS assigns the amplitude and phases of the input signals that result in maximum instantaneous efficiency and therefore the overall efficiency curve is the envelope of the efficiency curves in FIG. 5. Concept simulation using realistic GaN HEMT transistor models from Sumitomo shows PAE of more than 50% for a backoff of 12 dB.

From another perspective, the suggested AM outphasing technique results in an efficiency curve (envelope of curves in FIG. 5) that matches very well the idealized Chireix efficiency curve (FIG. 3) of the Chireix PA suggested by H. Chireix in 1935. A second efficiency local peak appears in deep power backoff (envelope of curves in FIG. 5) having its location related to the selected $\theta_c$ and therefore to the designed +jX and −jX Chireix compensation elements. The original Chireix analysis is based on ideal voltage sources assumption. In practice, however, as the output power is being varied through the outphasing action, so do the nonlinear Cds for instance. This shifts operation away from the idealized voltage sources assumption and deteriorates efficiency. Therefore, by applying AM modulation to the input signals in accordance with the outphasing angle modulation, the drift may be restored at the output side, bringing the PAs operation again to high efficiency performance for a certain desired output power level.

In an exemplary embodiment, HW blocs required for the implementation may include the same as for conventional outphasing (FIG. 1): a digital SCS, PA blocs, and an unmatched combiner.

An exemplary embodiment involves the implementation of the digital SCS. The combiner is designed accordingly, taking into account the signal's probability distribution. An exemplary embodiment enables providing very high PA efficiencies at no or low additional costs. It may be said that this effect is due to mitigating an RF HW issue (load modulation) into an already integrated digital domain. Since processing is required at baseband before mixing, existing modulators may cope with this, with a good possibility to employ one of the DSP boards.

Figure 6:
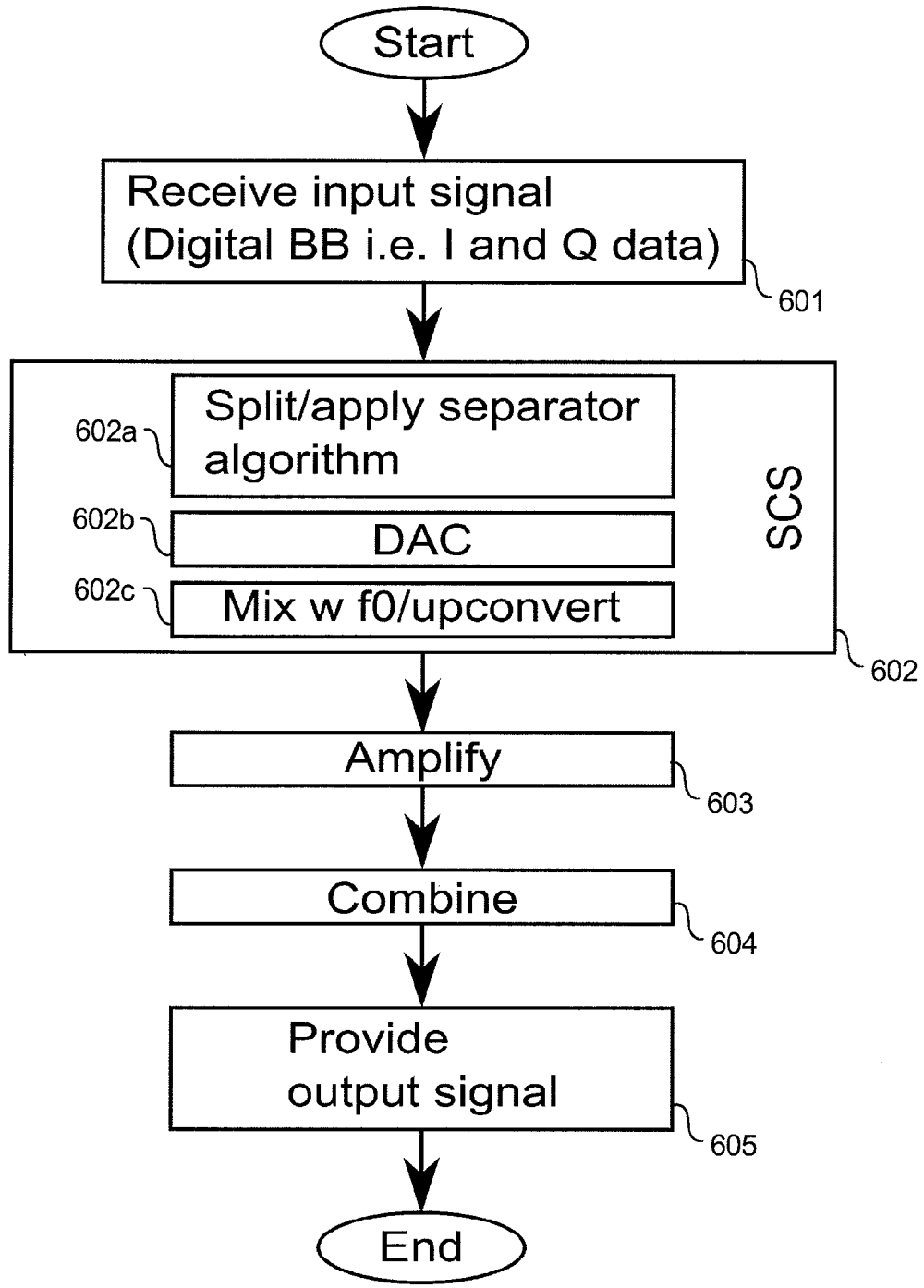
FIG. 6 shows a schematic diagram of a flow chart according to an exemplary embodiment of the invention.

FIG. 6 is a flow chart illustrating an exemplary embodiment. Referring to FIG. 6, in step 601, an input signal is received in the digital signal component separator SCS. In step 602, a signal component separator algorithm is applied in the digital signal component separator SCS to split an amplitude and phase modulated signal into a first phase modulated signal and a second phase modulated signal. In step 603, power amplifiers PA1, PA2 are used to amplify the split radio frequency (RF) signals (e.g. PA1 amplifies the first phase modulated signal, and PA2 amplifies the second phase modulated signal). In step 604, signal summation is performed in the combiner Σ for the, in step 603 amplified, signals. In step 605, an output signal is provided, having a maximum efficiency at each desired output signal power level. The component separator algorithm may be a look-up table based after characterization of the efficiency behaviour of PA through measurements. This may be carried out by running a measurement spanning a convenient range of input amplitudes and outphasing angles. For each measurement, the output power and corresponding efficiency is recorded (e.g. FIG. 5). Then a look-up table is formed containing the input and phase combination that results in the maximum efficiency for each desired output power level. Interpolation may be used in the process. Accordingly, the look-up table comprises new I and Q data (I1 and Q1, and I2 and Q2) to be generated 602a, converted 602b to analogue domain, modulated 602c with the carrier frequency f0, in order to be amplified using PA1 and PA2.

Figure 7:
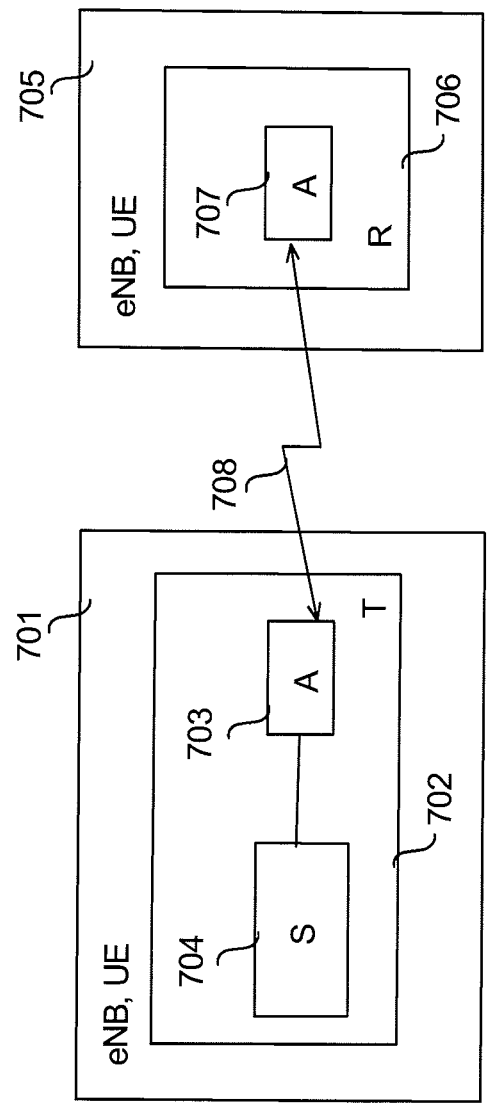
FIG. 7 illustrates apparatuses according to an exemplary embodiment of the invention.

FIG. 7 is a block diagram of an apparatus according to an exemplary embodiment. FIG. 7 shows a user equipment 705 located in the area of a radio network node 701. The user equipment 705 is configured to be in wireless connection 708 with the radio network node 701. The user equipment or UE 705 comprises a receiver R 706. The receiver 706 comprises an antenna A 707 configured to receive a radio frequency signal 708 from the radio network node 701. The user equipment 705 may also comprise various other components, such as a user a controller, memory, transmitter, interface, camera, and media player. They are not displayed in the figure due to simplicity.

The radio network node 701, such as an LTE base station (eNodeB, eNB) or LTE-LAN access point (AP), comprises a transmitter T 704. The transmitter comprises an antenna A 703 configured to transmit a radio frequency signal 708 to the user equipment 705, and an amplifier system A 704. The amplifier system 704 comprises a digital signal component separator SCS configured to split an amplitude and phase modulated signal into a first phase modulated signal and a second phase modulated signal, a non-isolating combiner Σ configured to perform a signal summation of the first phase modulated signal and the second phase modulated signal, a first power amplifier PA1 (may a be chain of amplifiers) configured to perform amplification of the first phase modulated signal before the signal summation, and a second power amplifier PA2 (may a be chain of amplifiers) configured to perform amplification of the second phase modulated signal before the signal summation, as described above in connection with FIG. 1 and/or FIG. 2. The amplifier system 704 is configured to apply a signal component separator algorithm such that the first outphased and second outphased split signals are allowed to take on several discrete/continuous amplitude levels in order to achieve a maximum efficiency at each desired output signal power level, without restricting the input signal power fed to the power amplifiers PA1, PA2 to a constant level, wherein for each desired output signal power level, the digital signal component separator (SCS) assigns an amplitude and phases of input signals that result in a maximum instantaneous power efficiency of the amplifier system. The component separator algorithm may be a look-up table based after characterization of the efficiency behaviour of the PA through measurements. This may be carried out by running a measurement spanning a convenient range of input amplitudes and outphasing angles. For each measurement, the output power and corresponding efficiency is recorded (e.g. FIG. 5). Then a look-up table is formed containing the input and phase combination that results in the maximum efficiency for each desired output power level. Interpolation may be used in the process. Accordingly the look-up table contains new I and Q data (I1 and Q1, and I2 and Q2) to be generated, converted to analogue domain, modulated with the carrier frequency, in order to be amplified using PA1 and PA2.

The radio network node 701 may be operationally connected (directly or indirectly) to another network element of the communication system, such as a radio network controller (RNC), a mobility management entity (MME), an MSC server (MSS), a mobile switching centre (MSC), a radio resource management (RRM) node, a gateway GPRS support node, an operations, administrations and maintenance (OAM) node, a home location register (HLR), a visitor location register (VLR), a serving GPRS support node, a gateway, and/or a server, via an interface. The embodiments are not, however, restricted to the network given above as an example, but a person skilled in the art may apply the solution to other communication networks provided with the necessary properties. For example, the connections between different network elements may be realized with internet protocol (IP) connections.

Although the apparatus 701, 705 has been depicted as one entity, different modules and memory may be implemented in one or more physical or logical entities. The apparatus 701 may also be a user terminal UE which is a piece of equipment or a device that associates, or is arranged to associate, the user terminal and its user with a subscription and allows a user to interact with a communications system. The user terminal presents information to the user and allows the user to input information. In other words, the user terminal may be any terminal capable of receiving information from and/or transmitting information to the network, connectable to the network wirelessly or via a fixed connection. Examples of the user terminals include a personal computer, a game console, a laptop (a notebook), a personal digital assistant, a mobile station (mobile phone), a smart phone, and a line telephone.

The apparatus 701, 705 may generally include a processor, controller, control unit or the like connected to a memory and to various interfaces of the apparatus. Generally the processor is a central processing unit, but the processor may be an additional operation processor. The processor may comprise a computer processor, application-specific integrated circuit (ASIC), field-programmable gate array (FPGA), and/or other hardware components that have been programmed in such a way to carry out one or more functions of an embodiment.

The memory may include volatile and/or non-volatile memory and typically stores content, data, or the like. For example, the memory may store computer program code such as software applications (for example for the detector unit and/or for the adjuster unit) or operating systems, information, data, content, or the like for a processor to perform steps associated with operation of the apparatus in accordance with embodiments. The memory may be, for example, random access memory (RAM), a hard drive, or other fixed data memory or storage device. Further, the memory, or part of it, may be removable memory detachably connected to the apparatus.

The techniques described herein may be implemented by various means so that an apparatus implementing one or more functions of a corresponding mobile entity described with an embodiment comprises not only prior art means, but also means for implementing the one or more functions of a corresponding apparatus described with an embodiment and it may comprise separate means for each separate function, or means may be configured to perform two or more functions. For example, these techniques may be implemented in hardware (one or more apparatuses), firmware (one or more apparatuses), software (one or more modules), or combinations thereof. For a firmware or software, implementation can be through modules (e.g., procedures, functions, and so on) that perform the functions described herein. The software codes may be stored in any suitable, processor/computer-readable data storage medium(s) or memory unit(s) or article(s) of manufacture and executed by one or more processors/computers. The data storage medium or the memory unit may be implemented within the processor/computer or external to the processor/computer, in which case it can be communicatively coupled to the processor/computer via various means as is known in the art.

Thus, in an exemplary embodiment, the amplifier system comprises a digital signal component separator SCS configured to split an amplitude and phase modulated signal into a first phase modulated signal and a second phase modulated signal, a non-isolating combiner Σ configured to perform a signal summation of the first phase modulated signal and the second phase modulated signal, a first power amplifier PA1 (may be a chain of amplifiers) configured to perform amplification of the first phase modulated signal before the signal summation, and a second power amplifier PA2 (may be a chain of amplifiers) configured to perform amplification of the second phase modulated signal before the signal summation, wherein the amplifier system is configured to apply a signal component separator algorithm such that the first phase modulated signal and the second phase modulated signal are allowed to take on several discrete and/or continuous amplitude levels in order to achieve a maximum efficiency at each desired output signal power level, without restricting the input signal power fed to the power amplifiers PA1, PA2 to a constant level, wherein for each desired output signal power level, the digital signal component separator SCS assigns an amplitude and phases of input signals that result in a maximum instantaneous power efficiency of the amplifier system.

In an exemplary embodiment, the non-isolating combiner comprises a Chireix combiner designed in accordance with the input signal's probability distribution. The non-isolating combiner is not restricted to a Chireix one, as it may include harmonic terminations.

In an exemplary embodiment, the signal component separator algorithm is applied based on a look-up table. The look-up table may be obtained after characterization of the efficiency behaviour of the PA through measurements. This is done by running a measurement spanning a convenient range of input amplitudes and outphasing angles. For each measurement, the output power and corresponding efficiency is recorded (e.g. FIG. 5). Then the look-up table is formed containing the input and phase combination that results in the maximum efficiency for each desired output power level. Interpolation may be used in the process. Accordingly the look-up table contains new I and Q data (I1 and Q1, and I2 and Q2) to be generated, converted to analogue domain, modulated with the carrier frequency, in order to be amplified using PA1 and PA2.

In an exemplary embodiment, the amplifier system 704 comprises a digital predistorter P1 for digitally predistorting a signal in order to optimize linearity and intermodulation products. This may be done in conjunction with the SCS for optimizing efficiency. The algorithm of SCS may be programmed to incorporate DPD functions as well.

In an exemplary embodiment, the amplifier system 704 comprises a linear amplification using nonlinear components LINC outphasing system.

In an exemplary embodiment, a transmitter 702 is provided, comprising the amplifier system 704 as disclosed above, and an antenna 703 for transmitting a radio frequency RF signal.

In an exemplary embodiment, a base station eNB is provided, comprising the transmitter 702 as disclosed above.

In an exemplary embodiment, a mobile unit UE is provided, comprising the transmitter 702 as disclosed above.

In an exemplary embodiment, the amplifier system 704 is used for amplifying an input signal, wherein the input signal may be a base band radio frequency RF signal.

In an exemplary embodiment, a circuit element is provided for an amplifier system 704 comprising a digital signal component separator SCS configured to split an amplitude and phase modulated signal into a first phase modulated signal and a second phase modulated signal, a non-isolating combiner Σ configured to perform a signal summation of the first phase modulated signal and the second phase modulated signal, a first power amplifier PA1 configured to perform amplification of the first phase modulated signal before the signal summation, and a second power amplifier PA2 configured to perform amplification of the second phase modulated signal before the signal summation. The circuit element is configured to apply a signal component separator algorithm such that the first phase modulated signal and the second phase modulated signal are allowed to take on several discrete and/or continuous amplitude levels in order to achieve a maximum efficiency at each desired output signal power level, without restricting the input signal power fed to the power amplifiers PA1, PA2 to a constant level, wherein for each desired output signal power level, the digital signal component separator SCS assigns an amplitude and phases of input signals that result in a maximum instantaneous power efficiency of the amplifier system.

It will be obvious to a person skilled in the art that, as the technology advances, the inventive concept can be implemented in various ways. The invention and its embodiments are not limited to the examples described above but may vary within the scope of the claims.

List of Abbreviations
AM amplitude modulated
BTS base transceiver station
DPD digital predistortion
DSP digital signal processing
ET envelope tracking
IAMO input amplitude modulated outphasing
LINC linear amplification using nonlinear components
PA power amplifier
PAPR peak to average power ratio
PM phase modulated
SCS signal component separator
WCDMA wideband code division multiple access
RF radio frequency
HW hardware
BB base band

The invention claimed is:

1. An amplifier system comprising
a digital signal component separator configured to split an amplitude and phase modulated signal into a first phase modulated signal and a second phase modulated signal,
a non-isolating combiner configured to perform a signal summation of the first phase modulated signal and the second phase modulated signal,
a first power amplifier configured to perform amplification of the first phase modulated signal before the signal summation, and
a second power amplifier configured to perform amplification of the second phase modulated signal before the signal summation,
wherein the amplifier system is configured to apply a signal component separator algorithm such that the first phase modulated signal and the second phase modulated signal are allowed to take on several discrete and/or continuous amplitude levels in order to achieve a maximum efficiency at each desired output signal power level, without restricting the input signal power fed to the power amplifiers to a constant level, wherein for each desired output signal power level, the digital signal component separator assigns an amplitude and phases of input signals that result in a maximum instantaneous power efficiency of the amplifier system.

2. The system according to claim 1, characterized in that the non-isolating combiner comprises a Chireix combiner designed in accordance with the input signal's probability distribution.

3. The system according to claim 1, characterized in that the non-isolating combiner includes harmonic terminations.

4. The system according to claim 1, characterized in that the system is configured to apply the signal component separator algorithm based on a look-up table.

5. The system according to claim 1, characterized in that it comprises a digital predistorter for digitally predistorting a signal in order to optimize linearity and intermodulation products.

6. The system according to claim 1, characterized in that it comprises a linear amplification using nonlinear components LINC outphasing system.

7. A transmitter comprising
an antenna for transmitting a radio frequency RF signal, and
an amplifier system according to claim 1.

8. A base station comprising a transmitter according to claim 7.

9. A mobile unit comprising a transmitter according to claim 7.

10. Use of an amplifier system according to claim 1 for amplifying an input signal.

11. Use according to claim 10, wherein the input signal is a base band radio frequency RF signal.

12. A method for operating an amplifier system comprising
a digital signal component separator configured to split an amplitude and phase modulated signal into a first phase modulated signal and a second phase modulated signal,
a non-isolating combiner configured to perform a signal summation of the first phase modulated signal and the second phase modulated signal,
a first power amplifier configured to perform amplification of the first phase modulated signal before the signal summation, and
a second power amplifier configured to perform amplification of the second phase modulated signal before the signal summation,
wherein the method comprises applying a signal component separator algorithm such that the first phase modulated signal and the second phase modulated signal are allowed to take on several discrete and/or continuous amplitude levels in order to achieve a maximum efficiency at each desired output signal power level, without restricting the input signal power fed to the power amplifiers to a constant level, wherein for each desired output signal power level, the digital signal component separator assigns an amplitude and phases of input signals that result in a maximum instantaneous power efficiency of the amplifier system.

13. The method according to claim 12, characterized in that the non-isolating combiner comprises a Chireix combiner designed in accordance with the input signal's probability distribution.

14. The method according to claim 12, characterized by applying the signal component separator algorithm based on a look-up table.

15. The method according to claim 12, characterized in that the system comprises a digital predistorter for digitally predistorting a signal in order to optimize linearity and intermodulation products.

16. The method according to claim 12, characterized in that the amplifier system comprises a linear amplification using nonlinear components LINC outphasing system.

17. A circuit element for an amplifier system comprising
a digital signal component separator configured to split an amplitude and phase modulated signal into a first phase modulated signal and a second phase modulated signal,
a non-isolating combiner configured to perform a signal summation of the first phase modulated signal and the second phase modulated signal,
a first power amplifier configured to perform amplification of the first phase modulated signal before the signal summation, and
a second power amplifier configured to perform amplification of the second phase modulated signal before the signal summation,
wherein the circuit element is configured to apply a signal component separator algorithm such that the first phase modulated signal and the second phase modulated signal are allowed to take on several discrete and/or continuous amplitude levels in order to achieve a maximum efficiency at each desired output signal power level, without restricting the input signal power fed to the power amplifiers to a constant level, wherein for each desired output signal power level, the digital signal component separator assigns an amplitude and phases of input signals that result in a maximum instantaneous power efficiency of the amplifier system.

* * * * *